United States Patent [19]

Hile

[11] 4,051,504
[45] Sept. 27, 1977

[54] ION IMPLANTED ZENER DIODE

[75] Inventor: John W. Hile, Birmingham, Mich.

[73] Assignee: General Motors Corporation, Detroit, Mich.

[21] Appl. No.: 622,081

[22] Filed: Oct. 14, 1975

[51] Int. Cl.² .............................................. H01L 29/90
[52] U.S. Cl. .................................... 357/13; 357/89; 357/90; 357/91
[58] Field of Search .................. 357/13, 89, 91, 90, 357/34, 23, 40

[56] References Cited

U.S. PATENT DOCUMENTS

| | | | |
|---|---|---|---|
| 3,244,949 | 4/1966 | Hilbiber | 357/13 |
| 3,470,390 | 9/1969 | Lin | 357/13 |
| 3,611,058 | 10/1971 | Jordan | 357/89 |
| 3,633,052 | 1/1972 | Hanna | 357/13 |
| 3,667,009 | 5/1972 | Rugg | 357/13 |
| 3,717,516 | 2/1973 | Hatcher et al. | 357/13 |
| 3,735,210 | 5/1973 | Kaush et al. | 357/13 |
| 3,882,529 | 5/1975 | Warner | 357/13 |
| 3,943,554 | 3/1976 | Russel et al. | 357/13 |

OTHER PUBLICATIONS

"Electronics", Apr. 26, 1971. p. 42.

Primary Examiner—Michael J. Lynch
Assistant Examiner—Joseph E. Clawson, Jr.
Attorney, Agent, or Firm—Robert J. Wallace

[57] ABSTRACT

A zener diode having an accurately predetermined breakdown voltage, and a method of making such a zener diode. A discrete device and integrated circuit adaptation of this device is disclosed. A specially highly doped opposite conductivity type island is embedded in a high resistivity body portion. Embedded in the body portion contiguous the island is an ion implanted surface portion of the one conductivity type. The surface portion has an accurately predetermined concentration of conductivity determining impurity atoms in the range of about $1 \times 10^{16}$ to $1 \times 10^{19}$ atoms per cubic centimeter. A PN junction having a high breakdown voltage separates the island from the body. A PN junction having a lower but accurately predetermined breakdown voltage separates the island from the surface portion and forms a zener junction. In integrated circuit adaptations, this device preferably shares a transistor electrode for a transistor junction that is to be protected from overvoltage effects.

4 Claims, 18 Drawing Figures

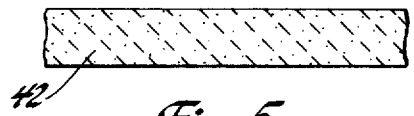
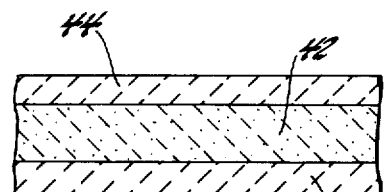
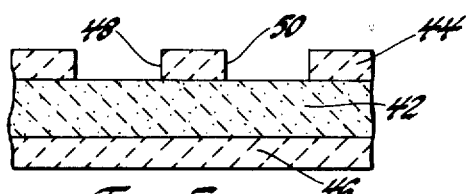
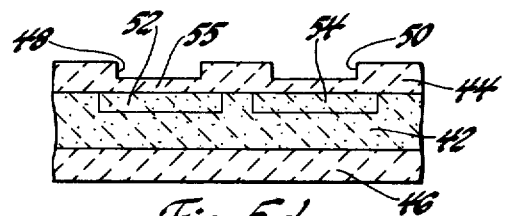
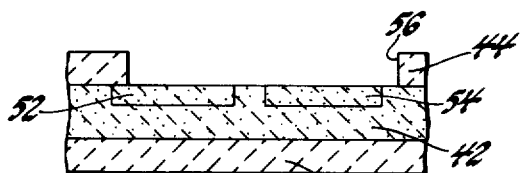
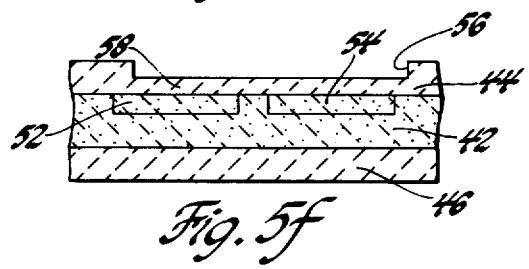
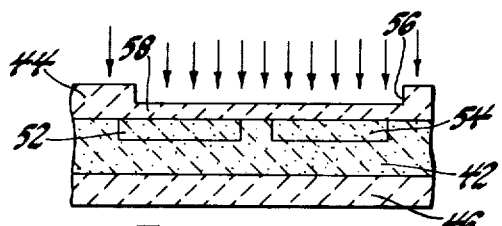
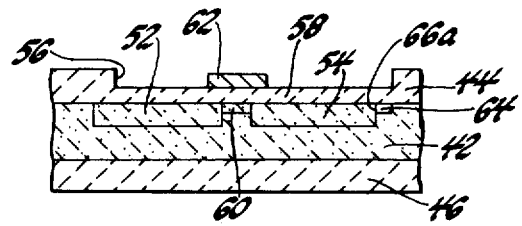
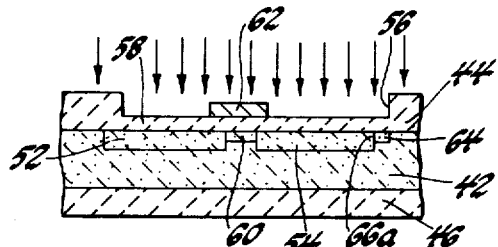
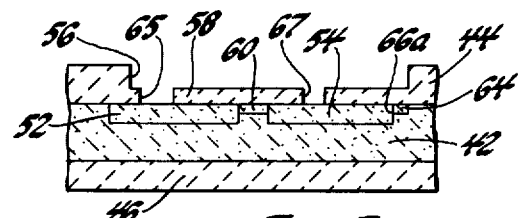
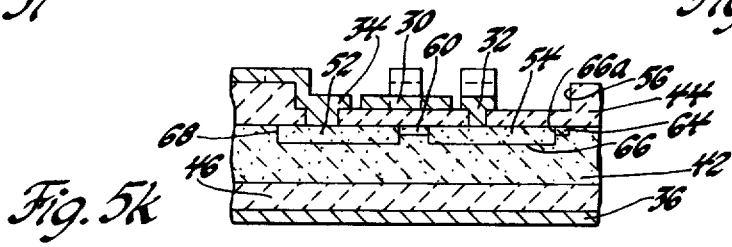

ION IMPLANTED ZENER DIODE

BACKGROUND OF THE INVENTION

This invention relates to a zener diode for use as a discrete device and as a component in an integrated circuit. Adaptations for both bipolar transistor type and insulated gate field effect transistor (IGFET) type integrated circuits are disclosed. This invention also relates to a method of making such discrete and integrated circuit configurations.

More specifically, this invention relates to a zener diode having a very accurately predictable breakdown voltage, which can be consistently produced under commercial production conditions. It also relates to a unique device configuration which, when incorporated in an integrated circuit, shares an electrode in common with a bipolar transistor or an IGFET.

A zener diode is a solid state device having two contiguous regions of opposite conductivity type and a PN junction at the interface of the two regions. Typically one of the regions is more lightly doped than the other, and is the region chiefly affecting breakdown voltage of the PN junction. Small variations in the doping level in this letter region can produce undesirably large variations in breakdown voltage of the PN junction. Commercial diffusion practices simply are not controllable enough to avoid such small variations from one diffusion run to another. Moreover, such variations are frequently found among slices in the same diffusion run, and even across the face of a given slice. Analogously, uniformity in such lighter doping is difficult to obtain when growing monocrystalline bodies and forming epitaxial layers. This results in lower yiels of zener diodes having the breakdown voltage desired. Lower yields of a device having the intended characteristics will ordinarily increase the manufacturing cost of that device. In addition, the lower yields may even make it economically impractical to incorporate that device in an integrated circuit.

I have discovered a new zener diode that is unaffected by small variations in original or diffusion doping but which is readily produced with currently available commercial production techniques. Accurately predetermined breakdown voltages can thus be consistently obtained under commercial production conditions. Moreover, my zener diodes can be readily incorporated in both bipolar transistor and IGFET integrated circuits. Thus, integrated circuits can be readily made that include zener diodes with accurately predetermined breakdown voltages. My zener diode can share an electrode and even a region in common with a transistor receiving its overvoltage protection. Such use of my zener diode in an integrated circuit reduces the number of electrode connections, as well as the integrated circuit area otherwise needed. This, of course, increases reliability and reduces cost.

OBJECTS AND SUMMARY OF THE INVENTION

Principal objects of this invention are to provide a novel zener diode and a method of making it.

Further objects of this invention are to provide unique bipolar transistor and IGFET circuits incorporating zener diodes of this invention, and to provide methods of making them.

The invention comprehends forming the zener diode in a semiconductor body portion of one conductivity type having a resistivity greater than about 10 ohm-centimeter. A heavily doped opposite conductivity type island is formed in the body portion surface, preferably by diffusion. The dominant conductivity determining impurity in the island has at least a surface concentration at or above the limit of solid solubility of that impurity in the semiconductor body. A high breakdown voltage PN junction separates the island and body portion. A surface portion of the body contiguous the island is implanted with an accurately predetermined number of impurity atoms of the one conductivity type within the range of about $1 \times 10^{16}$ to $1 \times 10^{19}$ atoms per cubic centimeter of the semiconductor body. A PN junction with an accurately predetermined breakdown voltage separates the island and surface portion, and forms a zener junction. The effective impurity concentration in the island is accurately limited by impurity solid solubility in the material of the semiconductor body. The breakdown voltage of the zener junction is accurately controlled by merely controlling the dose of implanted impurity in the surface portion contiguous the island. Small variations in the doping of the body portion during its formation, e.g. during epitaxial or crystal growth, are negligible in the much more strongly but precisely doped surface portion. My zener diode can be integrated with the collector region of a bipolar transistor that is a discrete device or a component in an integrated circuit. It can also be formed in combination with the drain of an IGFET, especially in an integrated circuit. In both instances the zener diode shares an electrode in common with the transistor, and limits the voltage applied to the transistor junction associated with that electrode.

BRIEF DESCRIPTION OF THE DRAWING

Other objects, features and advantages of the invention will become more apparent from the following description of preferred embodiments thereof and from the drawings, in which:

FIGS. 5a through 5k are sectional views, with background lines omitted, illustrating the steps in manufacturing the device shown in FIG. 4, with FIG. 5k being along the line 5—5 of FIG. 4.

DESCRIPTION OF THE PREFERRED EMBODIMENTS

Figure 1:
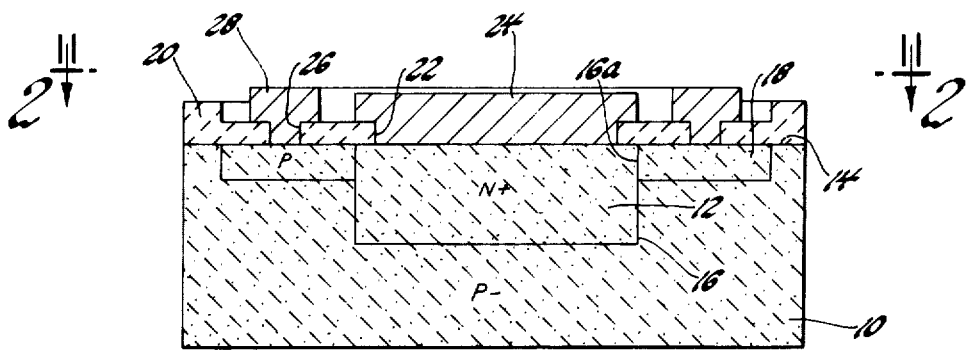
FIG. 1 is a sectional view showing a discrete zener diode formed in accordance with the invention.
Figure 2:
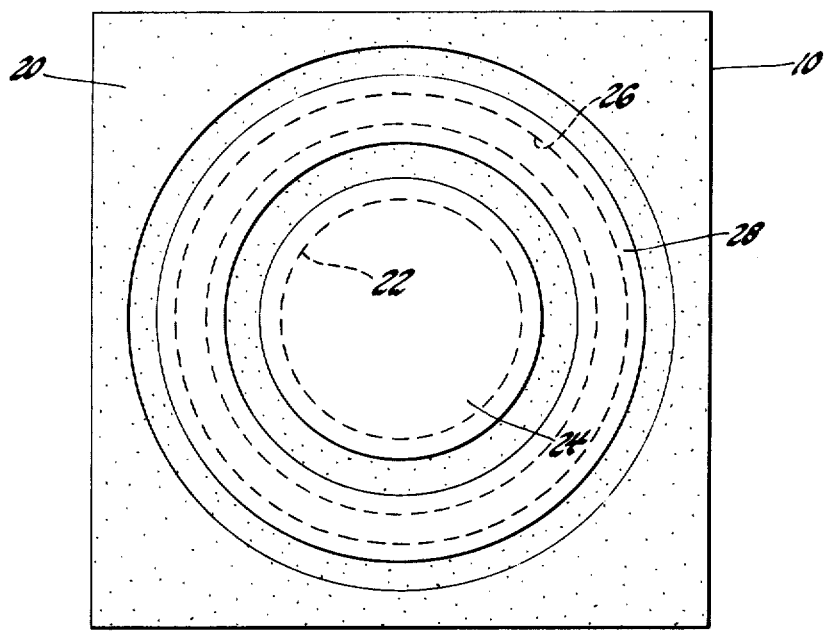
FIG. 2 is a plan view along the line 2—2 of FIG. 1.

Reference is now made to FIGS. 1 and 2, which show a discrete zener diode made in accordance with this invention. The zener diode has a homogeneously doped monocrystalline P-type silicon body 10 with a [100] crystal orientation. The body 10 is a silicon die about 1 mm square and 0.25 mm thick, having a given resistivity within the range of about 10 - 100 ohm-centimeters. This corresponds to a P-type doping in the body 10 of about $1 \times 10^{14}$ to $1 \times 10^{15}$ P-type conductivity determining impurity atoms per cubic centimeter of silicon. In this example body 10 has a resistivity of about 10 ohm-centimeters. The homogeneous doping of body 10 can be produced by doping body 10 as it is formed, as for example during growth of a crystal boule or epitaxial layer. The crystal boule or epitaxial layer is produced in the normal and accepted manner.

A circular island-like N+ region 12 is inset within surface 14 of body 10, forming a high breakdown voltage PN junction 16 with body 10. Region 12 is about 0.25 mm in diameter and about 10 microns deep. The conductivity determining impurity in region 12 is phosphorus, arsenic, antimony or the like. Region 12 in body 10 can be formed by alloying a lead or tin alloy containing at least one of these impurities to surface 14. However, it is preferably formed by diffusion of a single impurity in the normal and accepted manner. In the latter instance, the concentration of N-type impurity, for example phosphorus, in region 12 decreases with increasing distance below surface 14. However, regardless as to how region 12 is formed, at surface 14 and for a distance of at least 3000 A below surface 14, the concentration of the N-type impurity in region 12 is at or above the maximun concentration that can be retained in solid solution by the silicon. For example, if the impurity is phosphorus, the concentration of phosphorus in region 12 at surface 14 and for a distance 3000 A below that surface 14 is at least about $1 \times 10^{21}$ atoms of phosphorus per cubic centimeter of silicon.

An annular p+ portion 18 is inset in surface 14 of body 10 contiguous to and circumferentially surrounding region 12. Thus, the inner diameter of annular surface portion 18 is the same as the diameter of region 12 and a low breakdown voltage PN junction 16a exists at their interface.

Surface portion 18 contains an accurately predetermined number of implanted P-type impurity atoms in a concentration the produces a low and accurately predetermined breakdown voltage for PN junction 16a. The breakdown voltage of PN junction 16a is at least one order of magnitude less than the breakdown voltage of PN junction 16. Surface portion 18 has a truncated generally Gaussian profile in concentration through its thickness, with its maximum concentration about 1000 A below surface 14. The Gaussian concentration profile is an inherent characteristic of ion implanted regions. The concentration profile is truncated in body 10 at surface 14, but actually continues into the covering thin oxide layer.

The maximum concentration of p-type impurity atoms in surface portion 18 is within the range of about $1 \times 10^{16}$ to $1 \times 10^{19}$ atoms per cubic centimeter of silicon. Surface concentration of the p-type impurity atoms in surface portion 18 is at least about $1 \times 10^{15}$ p-type atoms per cubic centimeter of silicon. It should be recognized that a small concentration of p-type impurity atoms is already present in surface portion 18 before ion implantation. Accordingly, the ion dose given to surface portion 18 is precisely controlled to provide a total impurity content in surface portion 18 within the aforementioned range. Extremely precise original doping of body 10 is unnecessary because the precise doping by ion implantation in surface portion 18 is several orders of magnitude greater. Minor variations in original doping thus have only a negligible effect.

The preferred depth of maximum concentration in region 18 is generally about 500 to 2000 A, and preferably about 1000 A. If less then 500 A, the effective zener area is reduced. If more than 2000 A, the ion beam acceleration voltage requirements become prohibitive. Surface portion 18 can be of any convenient width, as for example about 0.5 micron. It can be only wide enough to permit an electrode to contact it. On the other hand, it may cover the entire surface 14 surrounding region 12. The preferred width of surface portion 18 is a function of device size and overall economics.

A silicon dioxide layer 20 on surface 14 passivates the surface and protects PN junction 16a. The central portion of silicon dioxide layer 20 is about 10,000 angstroms thick, while the peripheral portion is somewhat thicker, as for example about 13,000 - 15,000 angstroms thick. Silicon dioxide layer 20 has a circular window 22 over region 12. A circular metal electrode 24 about 5000 A thick and 0.3 mm in diameter provides electrical contact to region 12 through window 22. An annular window 26 is provided in silicon dioxide layer 20 over region 18. An equally thick annular metal electrode 28 about 0.08 mm wide provides electrical contact to region 12 through window 26. Electrodes 24 and 28 can be of evaporated aluminum. However the thickness, size and composition of electrodes 24 and 28 are no more relevant to this invention than in any other semiconductive device. Hence, usual dimensions and compositions can be used.

A plurality of devices such as shown in FIGS. 1 and 2 normally would be simultaneously made from a single silicon wafer. Each device would be made the same way. For simplicity I shall discuss the making of just one such device on the wafer. In such instance, the wafer would initially be oxidized to coat both of its major surfaces with a layer of silicon dioxide that is approximately 10,000 angstroms thick. An opening in the silicon dioxide layer is then made by photoetching techniques to expose a device central area on silicon surface 14.

Phosphorus is then diffused into silicon surface 14 through the opening to form the island-like region 12. Region 12 can be formed in any of the known and accepted diffusion techniques. One such technique involves initially subjecting the exposed silicon surface 14 to an atmosphere containing phosphorus oxychloride and oxygen for about 5 minutes at a temperature of about 1000° C. The atmosphere is then changed to $N_2$ + $O_2$ and the temperature increased to about 1100° C. for about 1 hour. This reforms an oxide coating over the exposed part of surface 14 and drives the phosphorus into the silicon surface and makes region 12 about 10 microns thick.

After the phosphorus diffusion, a new circular opening, congruent with the intended outer periphery of surface portion 18, is photoetched through the oxide coating. A fresh silicon dioxide layer about 1000 - 2000 angstroms thick is regrown in this circular opening. The entire surface 14 of the wafer is then bombarded with boron ions having an energy of approximately 50 - 70 keV, preferably 60 keV. Most of the boron ions penetrate the fresh thin oxide layer within the circular opening. They lodge within body 10 a short distance below surface 14 and more heavily dope it to form p+ surface portion 18. The thicker portions of the silicon dioxide layer surrounding the fresh oxide layer in the circular opening mask surface 14 from the boron ions. Since N-type region 12 is so heavily doped, it need not be masked.

Implantation of the boron impurity ion into body 10 is conducted in the usual manner to provide a substantially uniform impurity density in surface portion 18 parallel to surface 14. The substrate is preferably at an angle at about 7° from perpendicular to the ion beam. A dose of at least about $3 \times 10^{13}$ boron atoms per cm² of surface is given. This corresponds to an average increase in a bulk doping density of $1 \times 10^{17}$ per cm³, since the proportionality constant is $3.3 \times 10^3$ cm$-1$ for an energy of 60 keV.

Implantation energies of 50 - 70 keV will insure that the majority of boron ions in a beam will penetrate the 1000 angstrom thick silicon dioxide layer and lodge within about 1000 A of the surface 14. This is within the maximum concentration thickness of region 12. If a thicker coating, thinner coating, or no coating is used over the implant area, the ion energy should be correspondingly adjusted. Once this is set, one need only vary the ion dose to get an accurately predetermined but low breakdown voltage between region 12 and surface portion 18. The dose is easily monitored by monitoring ion current during implantation. For the device described, a boron dose of $3 \times 10^{13}$ per cm² produces a breakdown voltage of about 15 volts. A boron dose of $3 \times 10^{15}$ per cm² produces a breakdown voltage of about 5 volts. Higher doses, e.g. $3 \times 10^{17}$ per cm² produce correspondingly lower breakdown voltages.

Ion activation and damage annealing can be done by heating the wafer in dry nitrogen at 925° C. for 20 minutes. Such a treatment is at too low a temperature and for too short a time to produce any noticeable diffusion of implanted ions, or of impurities previously diffused into region 12. Analogously, if the subsequently applied aluminum metallization is annealed, the time and temperature for such annealing is not sufficient to produce any measurable redistribution of the implanted or diffused ions.

The silicon dioxide coating, windows and electrodes can be formed in the normal and accepted manner, as for example thermal oxidation, photoetching, and aluminum or gold metallization. The metallization would include blanket deposition of evaporated electrode metal followed by photoetching, or by evaporation through an appropriate mask.

Figures 3, 4:
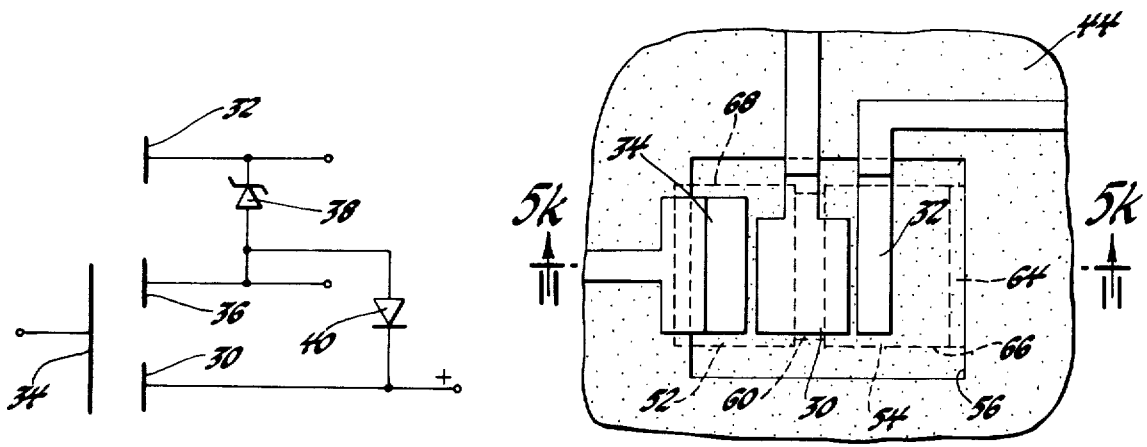
FIG. 3 is a schematic electrical diagram representing the IGFET integrated circuit portion shown in FIG. 4.
FIG. 4 is a fragmentary plan view showing one IGFET in an integrated circuit in which a zener diode of this invention is combined with the transistor.

FIG. 3 shows an electrical schematic diagram of a composite IGFET and zener diode produced in accordance with this invention. The transistor has source electrode 30 and drain electrode 32 along with gate electrode 34 and substrate electrode 36. Substrate electrode 36 is preferred but not necessary to the invention. If desired the substrate can be electrically floating. In this example, a zener diode 38 formed in accordance with this invention is connected between drain electrode 32 and both substrate electrode 36 and source electrode 30. The sourcesubstrate PN junction is represented by the forward biased diode 40. Thus, current passing through zener diode 38 has a parallel path around the transistor drain through the substrate and/or the source electrodes, one of which is usually grounded. A current limiting resistor (not shown) would, of course, also be used in series with drain electrode 32. It can be incorporated in the integrated circuit, preferably as an IGFET with a source to gate short, or supplied as a discrete device external to the circuit.

FIG. 5 illustrates successive steps that can be used to produce the composite zener diode and metal-insulator semiconductor transistor schematically illustrated in FIG. 3. It is to be understood that FIGS. 3 -5 illustrate just a portion of one integrated circuit unit, and that many such integrated circuit units would be made simultaneously on a single wafer. However, for simplicity, only the one such portion is shown. Also, the FIG. 4 structure can be produced by more sophisticated diffusion and ion implantation techniques than hereinafter described in connection with FIG. 5. Specific refinements in diffusion and ion implantation technology are not included nor are refinements such as self-aligning gates, field passivation, etc., included in the description. They may be as useful in this invention as they are in other integrated circuit structures. They are only omitted to more strongly focus on the novel aspects of this invention. FIG. 5a shows a 25 ohm-centimeter P-type silicon substrate 42. It is thermally oxidized to form silicon dioxide diffusion masking layers 44 and 46 on its top and bottom surface, respectively. The oxidized substrate is shown in FIG. 5b. Two adjacent but spaced identical rectangular windows 48 and 50 are formed by photoetching the silicon dioxide top layer 44, shown in FIG. 5c.

The P-type silicon substrate 42 is then treated at an elevated temperature, as described in connection with FIGS. 1 and 2, to diffuse phosphorus into silicon body 42 through each of windows 48 and 50. As can be seen in FIG. 5d, N× source and drain regions 52 and 54 are formed in P-type substrate 42 and an oxide layer 55 is reformed in windows 48 and 50. The phosphorus surface concentration in regions 52 and 54 is above the solubility of phosphorus in solid silicon and has a concentration profile similar to region 12 in FIGS. 1 and 2.

A large rectangular window 56 is then opened in top silicon dioxide layer 44 by photoetching. As seen in connection with FIGS. 4 and 5e, window 56 is wider than source 52 and drain 54, and has a length extending from the left center of source 52 to an area beyond the right side of drain 54. Thus, source 52 is partially exposed and drain 54 completely exposed by window 56. A thin silicon dioxide layer 58 approximately 1000 angstroms thick is regrown on the surface of substrate 42 exposed within window 56. The top surface of substrate 42 is irradiated with boron ions having an energy of about 60 KeV. The boron ions will penetrate the thin silicon dioxide layer 58 in window 56 but not the thicker peripheral portions of oxide layer 44. A light boron ion dose of about $1 \times 10^{12}$ per cm² is given to insure that channel region 60 between the source 52 and drain 54 will have a positive threshold, and form an enhancement mode IGFET. If a depletion mode IGFET is desired, the boron implantation of FIG. 5g is omitted. Instead, all of the thin silicon dioxide layer 58 is masked with a photoresist, except for the channel region 60 between source 52 and drain 56. The top surface of body 42 is then irradiated with phosphorus ions at about 60 keV, in a dose of about $1 \times 10^{15}$ per cm² to form an N-type channel 60. The photoresist would then be removed and the process continued the same as hereinafter described for the enhancement mode device.

After the channel region 60 is implanted with boron or phosphorus a strip of photoresist 62 is applied over the channel region 60. This masks this channel region 60 during the next step, which is a blanket boron ion implantation within the periphery of windom 56. As shown in FIG. 5i, the top surface of substrate 42 is then irradiated with 60 keV boron ions a second time. This time the substrate is given a dose of about $3 \times 10^{15}$ per cm². A more strongly doped P-type portion 64 is prproduced in all P-type surface portions of substrate 42 covered only by the thin silicon dioxide layer 58. The additional doping of surface portion 64 by ion implantation brings the original light P-type doping (P-) up to a higher P-type level. However, the combined doping is still significantly less than the doping of source region 52 and drain region 54, which are of opposite conductivity type. Only a small portion of surface portion 64 is visible in FIGS. 5i – 5k. Background lines in FIG. 5 have been omitted to help focus on the presence of ion implanted surface portion 64, which is fully shown in FIG. 4. The ion current is monitored during implantation of region 64 to determine to dosage, and the dosage is accurately controlled to produce the precise doping desired for surface portion 64. The source and drain regions 52 and 54 need not be masked because of the massive N+ doping therein.

The resist 62 is removed after his second ion implantation step. Annealing of substrate 42 can be done in the usual manner after ion implantation. Contact windows 65 and 67 are then photoetched through the thin silicon dioxide layer 58 as shown in FIG. 5j. Source and drain electrodes 30 and 32 are then formed in these windows, respectively. A gate electrode 34 is formed over the channel region 60. The electrodes can be produced by blanket aluminum metallization followed by photoetching.

As can be recognized from the foregoing, drain region 54 forms a PN junction 66 with substrate 42, and source region 52 forms a PN junction 68 with substrate 42. A PN junction 66a exists between drain region 54 and surface portion 64. As in the preceding embodiment of this invention, the breakdown voltage of PN junction 66a is at least an order of magnitude lower than the breakdown voltage of PN junction 66. Moreover, since drain region 54 is doped to the limit of solid solubility, the breakdown voltage of PN junction 66a is very precisely determined by the accuracy of the boron ion dosage given to surface portion 64. Thus, drain region 54 also serves as one region of a zener diode and the drain electrode 32 also forms one terminal for a zener diode. Surface portion 64 forms the second region of the zener diode. Substrate electrode 36 and source electrode 30 serve as parallel complementary electrodes for the zener diode, since they are in relatively low resistance electrical communication with surface portion 64. Depending on the resistivity and thickness of substrate 42, the lower resistance path of the two parallel paths may be through surface portion 64 to source electrode 30. The PN junction 68 of source region 52 is represented by the forward biased diode 40 in FIG. 3.

Figure 6:
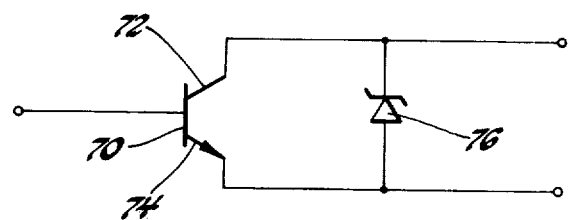
FIG. 6 is a schematic electrical diagram representing the bipolar transistor integrated circuit portion shown in FIG. 7.
Figure 7:
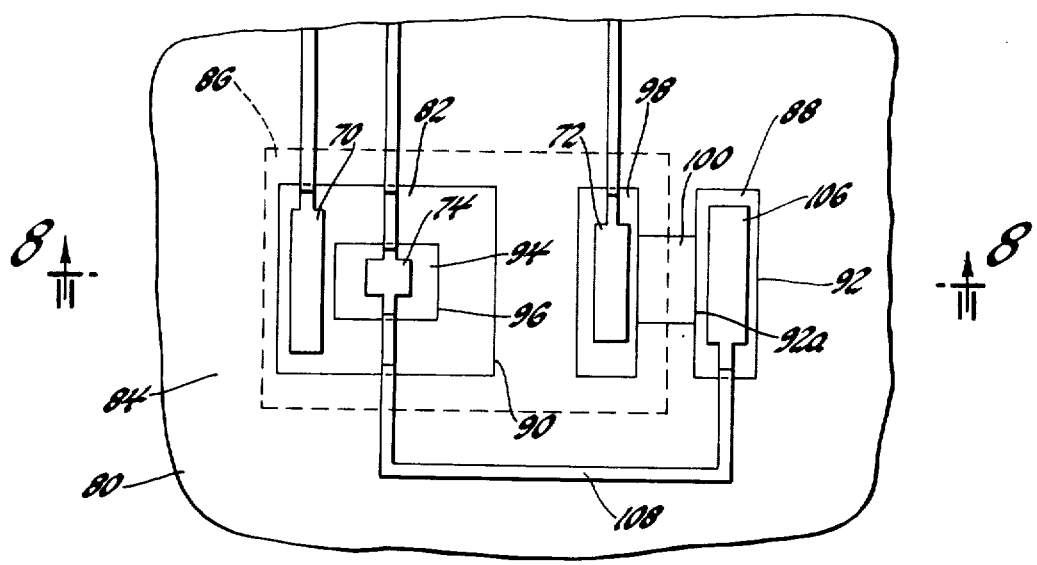
FIG. 7 is a fragmentary plan view showing one bipolar transistor in an integrated circuit in which a zener diode of this invention shares the transistor collector electrode.
Figure 8:
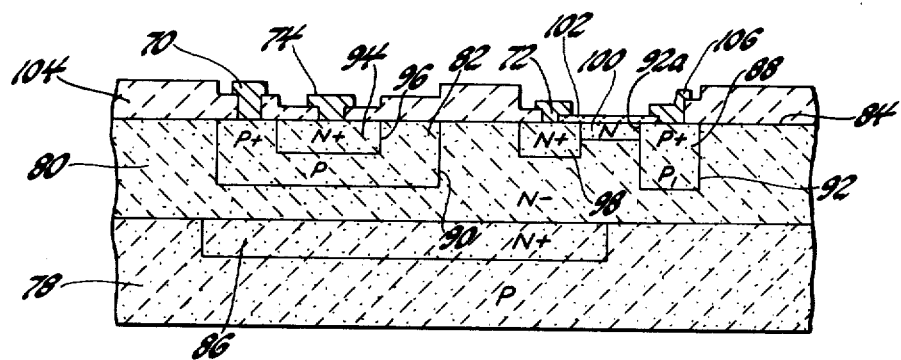
FIG. 8 is a sectional view along the lines 8—8 of FIG. 7.

FIG. 6 is an electrical schematic of the composite bipolar transistor-zener diode embodiment of this invention shown in FIGS. 7 and 8. FIG. 6 shows a bipolar transistor having a base electrode 70, a collector electrode 72, and an emitter electrode 74. Zener diode 76 is connected between the collector electrode 72 and the emitter electrode 74 to limit the voltage which can be applied to collector electrode 72. As with the preceding example of this invention, a current limiting resistor (not shown) would be used in series with collector electrode 72. It can be a component in the integrated circuit or a discrete device.

FIGS. 7 and 8 show a composite bipolar transistor and zener diode portion of an integrated circuit formed in a wafer of epitaxial material. To show the diffusion regions more clearly in FIG. 7, the covering oxide layer 104 of FIG. 8 is not shown. The epitaxial material includes a P-type wafer 78 of about 0.1 ohm-centimeter resistivity with an N-type epitaxial layer 80 on it of about 25 ohm-centimeter resistivity. The eptaxial layer form the collector region of the bipolar transistor. A rectangular P-type base region 82 is embedded in the top surface 84 of epitaxial N-type layer 80, over part of an N+ buried layer 86 at the wafer-epitaxial layer interface. A smaller rectangular P-type region 88 of the same depth as base region 82 is disposed within the N-type epitaxial layer 80 spaced from the base region 82. Regions 82 and 88 can be simultaneously produced by selectively diffusing a P-type impurity into surface 84 of epitaxial layer 80. The P-type impurity surface concentration of regions 82 and 88 is above the limit of solid solubility of the P-type impurity in silicon. Hence, they are, similar to but of opposite conductivity type from region 12 of FIGS. 1 and 2. The desired surface concentration in these regions can be obtained in a single diffusion but it may more generally be preferred to obtain it by means of a subsequent surface enhancement diffusion of the same or a different P-type impurity. Base region 82 forms a PN junction 90 with epitaxial layer 80, and region 88 forms a PN junction 92 with eptaxial layer 80. PN junctions 90 and 92 have the same high breakdown voltage.

An island-like N× region 94 is embedded within the base region 82 to form an emitter region for the bipolar transistor. It is preferably formed by diffusion and is separated from base region 82 by a PN junction 96. A rectangular N× diffusion region 98 is embedded in surface 84 and spaced between the two P-type diffusion regions 82 and 88 over buried layer 86. N× region 98 thus provides a low resistance ohmic connection to the N-type epitaxial layer and, through buried layer 86 to the transistor collector region beneath base region 82. An ion implanted N+ surface portion 100 extends from the N+ diffusion region 98 to the P-type diffusion region 88. Ion implanted surface portion 100 is separated from P-type region 88 by a PN junction 92a. Surface portion 100 is similar in concentration and function to surface portion to surface portion 18 in FIG. 1 and 2 but of opposite conductivity type. It is formed in an analogous manner to that hereinbefore described for surface portion 18, as for example through a thin portion 102 in a covering silicon dioxide layer 104. The thicker portions of silicon dioxide layer 104 mask the remainder of the surface 84 on epitaxial layer 80 from the impinging N-type impurity ions. As in the preceding examples of this invention, ion current is monitored during implantation to give an accurately controlled N-type ion dosage to surface portion 100. The dosage given is accurately predetermined to produce a low but accurately predetermined breakdown voltage in PN junction 92a. PN junction 92a is the PN junction for zener diode 76 in FIG. 6. The predetermined breakdown voltage of PN junction 92a is at least an order of magnitude lower than the breakdown voltage of PN junction 90. Hence, it can serve a zener function with respect to it.

Silicon dioxide layer 104 has windows in it for base electrode 70, emitter electrode 74, collector electrode 72 and a separate zener diode electrode 106, which respectively contact regions 82, 94, 98 and 88. Electrode 72 also is in low resistance electrical contact with ion implanted region 100. Thus, it also serves as a second zener diode electrode for zener PN junction 92a.

The conductor metallization on silicon dioxide layer 104 has a runner 108 interconnecting emitter electrode 74 with the separate zener diode electrode 106. Other runner portions are shown connected to electrodes 70, 72 and 74 merely to indicate that the Figures are portions of an intergrated circuit. In the FIGS. 6 - 8 construction, the transistor collector and zener diode share a common contact, collector electrode 72. Voltage applied to collector junction 90 is limited by the low but accurately predetermined breakdown voltage of the zener diode PN junction 92a.

I claim:

1. A zener diode having an accurately predetermined breakdown voltage comprising:
    a body of semiconductive material having at least a portion of one conductivity type intersecting a surface of said body;
    a minimum electrical resistivity in said portion of not less than about 10 ohm-centimeter;
    a first island-like region of opposite conductivity type semiconductive material inset within said portion and intersecting said surface;
    said first region having a first predetermined concentration of conductivity determining impurity of said opposite type adjacent said surface that is in excess of $1 \times 10^{19}$ atoms per cubic centimeter of semiconductive material;
    said first region and said portion forming a PN junction that has a breakdown voltage in excess of a predetermined voltage;
    a second region of more conductive one conductivity type within said portion and intersecting said surface, said second region being contiguous said first region and containing an accurately predetermined number of implanted one conductivity type impurity atoms in addition to one conductivity type impurity atoms determining said resistivity of said portion;
    said additional impurity atoms implanted in said second region having an accurately predetermined second concentration that is at least two orders of magnitude less than said first predetermined concentration and is within the range of $1 \times 10^{16}$ to $1 \times 10^{19}$ atoms per cubic centimeter of semiconductive material contiguous said first region;
    a PN junction between said first and second regions having an accurately predetermined breakdown voltage imparted by said predetermined concentrations that is lower than the breakdown voltage of the PN junction between said first region and said portion; and
    discrete low resistance electrical connections to said first and regions providing a zener diode having an accurately predetermined breakdown voltage.

2. A integrated circuit containing a zener diode with an accurately predetermined breakdown voltage and a transistor protected by and sharing an electrode in common with the zener diode, said integrated circuit comprising:
    a body of semiconductive material having a plurality of transistors formed therein adjacent a surface of said body;
    one of said transistors in a portion of said body that is of one conductivity type and lightly doped to a resistivity greater than about 10 ohm-centimeter, said transistor connected to circuit apparatus subject to voltage surges in excess of a predetermined operating voltage;
    a first island-like region of said one conductivity type implanted in the surface of said one conductivity type portion;
    an accurately predetermined first concentration of implanted impurity atoms of said one conductivity type in said first region and having a trucated gaussian distribution normal to said surface that is maximum about 500–2000 angstroms below said surface and said maximum is within the range of about $1 \times 10^{16}$ to $1 \times 10^{19}$ atoms per cubic centimeter of semiconductive material;
    a second island-like region of opposite conductivity type diffused within said body and forming a first PN junction with said body portion that has a breakdown voltage higher than said predetermined operating voltage, and a second PN junction with said first region that has a breakdown voltage equal to said predetermined breakdown voltage;
    a predetermined second concentration of conductivity determining impurity atoms of said opposite type in said second region that is maximum adjacent said surface and said maximum is at least two orders of magnitude greater than said first concentration;
    a first electrode means on said body in low resistance electrical communication with said body portion and said first region; and
    a second electrode means on said body in low resistance electrical communication with said second region.

3. An integrated circuit containing a zener diode with an accurately predetermined breakdown voltage and a metal-insulator-semiconductor field effect transistor protected by and having a region in common with the zener diode, said integrated circuit comprising;
    a body of semiconductive material having a plurality of metal-insulator-semiconductor field effect transistors formed therein adjacent a surface of said body;
    at least one of said transistor having a PN junction;
    a first region of one conductivity type semiconductive material extending from said transistor PN junction and intersecting said surface, said region electrically connected to circuit apparatus subject to voltage surges in excess of a predetermined operating voltage;
    a predetermined first concentration of conductivity determining impurity of said one type in said first region that is maximum adjacent said surface and said maximum is in excess of $1 \times 10^{19}$ atoms per cubic centimeter of semiconductive; material
    a second region of opposite conductivity type semiconductive material extending from said transistor PN junction and intersecting said surface, said portion having a resistivity of at least about 10 ohm-centimeter;
    a third region of opposite conductivity type implanted in said second region surface, a portion of said implanted third region being contiguous said first region and forming a second PN junction therewith coextensive with a portion of said transistor PN junction whereby said second PN junction can perform a zener diode function with respect to said transistor PN junction;
    an accurately predetermined second concentration of implanted impurity atoms of said opposite conductivity type in said third region at least adjacent said second PN junction to provide an accurately predetermined breakdown voltage for said second PN junction that is equal to the said predetermined operating voltage, said implanted impurity concentration being at least two orders of magnitude less than said first predetermined concentration and within the range of about $1 \times 10^{16}$ to $1 \times 10^{19}$ atoms per cubic centimeter of semiconductive material;

first electrode means on said body for applying a transistor operating voltage to both of said PN junctions through said first region; and second electrode means on said body in low resistance electrical communication with said third region by which transistor operating voltages in excess of said predetermined transistor operating voltage are limited with respect to said transistor PN junction by breakdown of said zener PN junction and said transistor is protected from unwanted overvoltage effects.

4. An integrated circuit containing a zener diode with an accurately predetermined breakdown voltage and a bipolar transistor protected by and having an electrode in common with the zener diode, said integrated circuit comprising:

a body of semiconductive material having a plurality of transistors formed therein adjacent a surface of said body;

at least one of said transistors having a collectors PN junction electrically connected to circuit apparatus subject to voltage surges in excess of a predetermined operating voltage;

one conductivity type portion of said body extending from said collector PN junction and intersecting said surface, said portion having a resistivity of at least about 10 ohm-centimeter;

a first island-like region of opposite conductivity type semiconductive material inset within said portion surface spaced from said junction;

a predetermined first concentration of conductivity determining impurity of said opposite type in said first region that is maximum adjacent said surface and said maximum is in excess of $1 \times 10^{19}$ atoms per cubic centimeter of semiconductive material;

a second island-like region of said one conductivity type implanted in said body surface spaced from said collector PN junction, a portion of said implanted second region being contiguous said first region and forming a second PN junction therewith;

an accurately predetermined second concentration of implanted impurity atoms of said one conductivity type in said second region adjacent said second PN junction to provide an accurately predetermined breakdown voltage for said second PN junction that is equal to the desired predetermined operating voltage of said collector PN junction whereby said second PN junction can perform a zener diode function with respect to said collector PN junction, said implanted impurity concentration being at least two orders of magnitude less than said first concentration and within the range of about $1 \times 10^{16}$ to $1 \times 10^{19}$ atoms per cubic centimeter of semiconductive material;

first electrode means on said body in low resistance electrical communication with said portion and said second region for applying a transistor operating voltage to both of said PN junctions;

a second electrode means on said body in low resistance electrical communication with said first region providing a discrete second electrode for said zener diode PN junction by which transistor operating voltages in excess of said predetermined transistor operating voltage are limited with respect to said collector PN junction by breakdown of said zener diode PN junction and said transistor is protected from unwanted overvoltage effects.

* * * * *